US009553033B2

United States Patent
Iloreta et al.

(10) Patent No.: US 9,553,033 B2
(45) Date of Patent: Jan. 24, 2017

(54) SEMICONDUCTOR DEVICE MODELS INCLUDING RE-USABLE SUB-STRUCTURES

(71) Applicant: KLA-Tencor Corporation, Milpitas, CA (US)

(72) Inventors: Jonathan Iloreta, Menlo Park, CA (US); Matthew A. Laffin, Fremont, CA (US); Leonid Poslavsky, Belmont, CA (US); Torsten Kaack, Los Altos, CA (US); Qiang Zhao, Milpitas, CA (US); Lie-Quan Lee, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/594,917

(22) Filed: Jan. 12, 2015

(65) Prior Publication Data
US 2015/0199463 A1    Jul. 16, 2015

Related U.S. Application Data

(60) Provisional application No. 61/927,832, filed on Jan. 15, 2014.

(51) Int. Cl.
*G06F 17/50*    (2006.01)
*H01L 21/66*    (2006.01)

(52) U.S. Cl.
CPC .................... *H01L 22/12* (2013.01)

(58) Field of Classification Search
CPC .. G06F 17/5068; G06F 17/5036; G06F 17/50; G06F 17/5018; G06F 2217/78; G06F 17/5063; G06F 17/11; G06F 17/5045;G06F 17/5054; G06F 17/5081; G06F 17/509; G06F 2217/08; G06F 2217/16; G06F 17/30554; G06F 3/01; H01L 22/20; H01J 37/3174; H01J 2237/31715; H01J 37/256; B82Y 10/00; G03F 7/705; G03F 7/70616
(Continued)

(56) References Cited

U.S. PATENT DOCUMENTS 5,608,526 A    3/1997 Piwonka-Corle et al.
5,859,424 A    1/1999 Norton et al.
(Continued)

*Primary Examiner* — Binh Tat
(74) *Attorney, Agent, or Firm* — Spano Law Group; Joseph S. Spano

(57) ABSTRACT

Methods and tools for generating measurement models of complex device structures based on re-useable, parametric models are presented. Metrology systems employing these models are configured to measure structural and material characteristics associated with different semiconductor fabrication processes. The re-useable, parametric sub-structure model is fully defined by a set of independent parameters entered by a user of the model building tool. All other variables associated with the model shape and internal constraints among constituent geometric elements are predefined within the model. In some embodiments, one or more re-useable, parametric models are integrated into a measurement model of a complex semiconductor device. In another aspect, a model building tool generates a re-useable, parametric sub-structure model based on input from a user. The resulting models can be exported to a file that can be used by others and may include security features to control the sharing of sensitive intellectual property with particular users.

20 Claims, 8 Drawing Sheets

(58) Field of Classification Search
  USPC .................................................. 716/100–106
  See application file for complete search history.

(56) References Cited

U.S. PATENT DOCUMENTS

| | | |
|---|---|---|
| 6,429,943 B1 | 8/2002 | Opsal et al. |
| 7,478,019 B2 | 1/2009 | Zangooie et al. |
| 7,933,026 B2 | 4/2011 | Opsal et al. |
| 8,879,073 B2 | 11/2014 | Madsen et al. |
| 2008/0195342 A1 | 8/2008 | Li et al. |
| 2008/0250384 A1* | 10/2008 | Duffy .................... G03F 7/7065 716/55 |
| 2009/0007043 A1* | 1/2009 | Lin .................... H01L 21/82380 716/119 |
| 2009/0037013 A1 | 2/2009 | Hendler et al. |
| 2009/0113368 A1* | 4/2009 | Lin ..................... G06F 17/5068 716/122 |
| 2009/0306941 A1 | 12/2009 | Kotelyanskii et al. |
| 2010/0088657 A1* | 4/2010 | Bantas ................ G06F 17/5068 716/136 |
| 2010/0175033 A1 | 7/2010 | Adel et al. |
| 2013/0110477 A1 | 5/2013 | Pandev |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |

\* cited by examiner

SEMICONDUCTOR DEVICE MODELS INCLUDING RE-USABLE SUB-STRUCTURES

CROSS REFERENCE TO RELATED APPLICATION

The present application for patent claims priority under 35 U.S.C. §119 from U.S. provisional patent application Ser. No. 61/927,832, entitled "Building Optical Metrology Models Based on Structure and Application Delineated Characteristics," filed Jan. 15, 2014, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Optical metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty.

In response to these challenges, more complex optical tools have been developed. Measurements are performed over a large ranges of several machine parameters (e.g., wavelength, azimuth and angle of incidence, etc.), and often simultaneously. As a result, the measurement time, computation time, and the overall time to generate reliable results, including measurement recipes, increases significantly.

In addition, existing model based metrology methods typically include a series of steps to model and then measure structure parameters. Typically, measurement data (e.g., DOE spectra) is collected from a particular metrology target. An accurate model of the optical system, dispersion parameters, and geometric features is formulated. In addition, simulation approximations (e.g., slabbing, Rigorous Coupled Wave Analysis (RCWA), etc.) are performed to avoid introducing excessively large errors. Discretization and RCWA parameters are defined. A series of simulations, analysis, and regressions are performed to refine the geometric model and determine which model parameters to float. A library of synthetic spectra is generated. Finally, measurements are performed using the library or regression in real time with the geometric model.

Currently, models of device structures being measured are assembled by a user of a measurement modeling tool from primitive structural building blocks. These primitive structural building blocks are simple geometric shapes (e.g., square frusta) that are assembled together to approximate more complex structures. The primitive structural building blocks are sized by the user based on user input that specifies the shape details of each primitive structural building block. In one example, each primitive structural building block includes an integrated customization control panel where a user inputs specific parameters that determine the shape details. Similarly, primitive structural building blocks are joined together by constraints that are also manually entered by the user. For example, the user enters a constraint that ties a vertex of one primitive building block to a vertex of another building block. This allows the user to build models that represent a series of the actual device geometries when the size of one building block changes. User-defined constraints between primitive structural building blocks enable broad modeling flexibility. For example, the thicknesses or heights of different primitive structural building blocks can be constrained to a single parameter in multi-target measurement applications. Furthermore, primitive structural building blocks have simple geometric parameterizations which the user can constrain to application-specific parameters. For example, the sidewall angle of a resist line can be manually constrained to parameters representing the focus and dose of a lithography process.

Although models constructed from primitive structural building blocks offer a wide range of modeling flexibility and user control, the model building process becomes very complex and error prone when modeling complex device structures. A user needs to assemble primitive structural building blocks together accurately, ensure they are correctly constrained, and parameterize the model in a geometrically consistent manner. Accomplishing this is not an easy task, and users spend significant amounts of time ensuring that their models are correct. In many cases, users do not realize their models are inconsistent and incorrect because it is difficult to comprehend how all of the primitive structural building blocks change shape and location in parameter space. Specifically, it is very difficult to determine if models that are structurally consistent for a given set of parameter values remain structurally consistent for another set of parameter values.

FIG. 1A depicts twelve different primitive structural building blocks 11-22 assembled together to form an optical critical dimension (OCD) model 10 depicted in FIG. 1B. Each primitive structural building block is rectangular in shape. To construct OCD model 10 a user must manually define the desired dimensions, constraints, and independent parameters (e.g., parameters subject to variation) of the model. Models constructed based on primitive structural building blocks (i.e., basic shapes such as rectangles) typically require a large number of primitives, constraints, and independent parameters for which the user must define ranges of variation. This makes model-building very complex and prone to user errors.

Furthermore, model complexity makes it difficult for one user to understand models built by another. The user needs to be able to understand the intent of the original model owner and this becomes increasingly challenging as the number of primitive structural building blocks, constraints, and independent parameters increases. Consequently, transferring ownership of models (e.g., from applications engineers to process engineers) is a time consuming, difficult process. In many cases, the complexity of the models leads to frustration amongst colleagues, and in some cases, prevents the transfer process from ever being fully completed. In some examples, a user generates a new model from primitive structural building blocks to mimic a model generated by a colleague. In many cases the resulting model is slightly different, and therefore delivers slightly different results due to the non-commutative property of floating point operations on computers. In some other examples, a user surrenders or risks intellectual property by having another firm develop the model.

Optical metrology structures have in the past remained simple enough that new models are commonly designed for each project. However, with increasingly complicated models and less time per project, improved modeling methods and tools are desired.

SUMMARY

Methods and tools for generating measurement models of complex device structures based on re-useable, parametric models are presented. Metrology systems employing these models are configured to measure structural and material characteristics (e.g., material composition, dimensional characteristics of structures and films, etc.) associated with different semiconductor fabrication processes.

In one aspect, a model building tool includes re-useable, parametric models of complex device sub-structures that are useable as building blocks in a model of a complex semiconductor device. This makes the model building process more intuitive and less error-prone. Furthermore, because the re-useable, parametric sub-structure models are optimized for specific structures and measurement applications, the resulting discretized measurement model is computationally more efficient than traditional models. In addition, the parametric sub-structure models can be saved and shared among different projects and different users.

In a further aspect, the re-useable, parametric sub-structure model is fully defined by the values of the independent parameters entered by the user of the model building tool. All other variables associated with the model shape and internal constraints among constituent geometric elements are pre-defined within the model. Thus, beyond the values of the independent parameters, no other user input is required to fully define the re-useable, parametric sub-structure model. This greatly simplifies the model building process.

In another further aspect, a model building tool integrates one or more re-useable, parametric models into a measurement model of a complex semiconductor device. In some embodiments, a measurement model of a semiconductor device is fully described by one re-useable, parametric model. In some other embodiments, a measurement model of a semiconductor device is fully described by a combination of two or more re-useable, parametric models.

In another aspect, a model building tool generates a re-useable, parametric sub-structure model based on input from a user. In some embodiments, a model building tool generates a re-useable, parametric sub-structure model based on a composition of a number of simpler geometric primitives, or simpler re-useable, parametric sub-structure models indicated by a user. The composition changes the collection of individual models into a single re-useable, parametric sub-structure model that can be used as an element of a measurement model as if it is a primitive building block.

Re-useable, parametric sub-structure models can be generated in different ways. In one example, a user directs the model building tool to combine and constrain one or more geometric primitives, one or more existing sub-structure models, or any combination by user-generated computer code. In another example, a re-useable, parametric sub-structure model is based on more complex geometric structures, and thus is an amalgamation of fewer, more complex geometric primitives. In yet another example, a user may interact with a graphical user interface (GUI) that allows a user to select one or more geometric primitives, one or more existing sub-structure models, or any combination, and then indicate the users desire to group these elements together and select the desired independent parameters. In response the model building tool automatically generates the appropriate constraints to realize a fully integrated parametric sub-structure model.

In another further aspect, the user can export a newly created parametric sub-structure model into a file that can be used by others. In another example, a newly created parametric sub-structure model can be listed in the model building tool as an available building block that can be selected by a user to construct a measurement model, or yet another, more complex parametric sub-structure model.

In another further aspect, the model building tool generates and makes available for use, re-useable, parametric models of complex device sub-structures that include key characteristics of specific semiconductor processes embedded into their design. More specifically, a re-usable, parametric sub-structure model includes controls that allow the user to specify wafer artifacts created by one or more process steps.

In another further aspect, the model building tool generates and makes available for use, re-useable, parametric models of complex device sub-structures that include measurement application specific details (e.g., constraints, dimensions, etc. that derive from particular applications).

In yet another aspect, the model building tool includes security features to control the sharing of sensitive intellectual property with particular users.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and tools for generating measurement models of complex device structures based on re-useable, parametric models are presented. Metrology systems employing these models are configured to measure structural and material characteristics (e.g., material composition, dimensional characteristics of structures and films, etc.) associated with different semiconductor fabrication processes.

Figure 2:
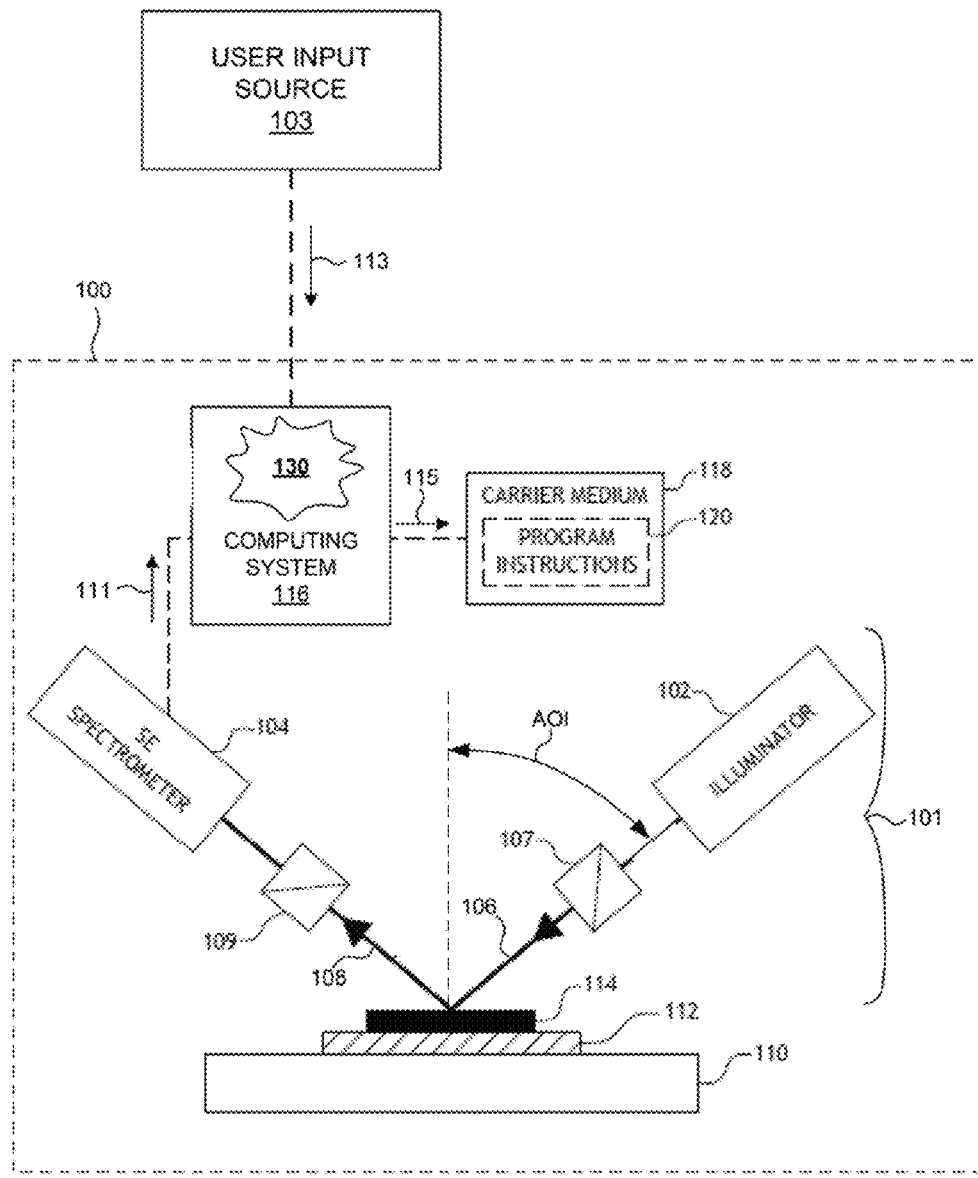
FIG. 2 is a diagram illustrative of a system 100 for measuring characteristics of a semiconductor wafer.

FIG. 2 illustrates a system 100 for measuring characteristics of a semiconductor wafer. As shown in FIG. 2, the system 100 may be used to perform spectroscopic ellipsometry measurements of one or more structures 114 of a semiconductor wafer 112 disposed on a wafer positioning system 110. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 150-1700 nm) to the structure 114 disposed on the surface of the semiconductor wafer 112. In turn, the spectrometer 104 is configured to receive light from the surface of the semiconductor wafer 112. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by the spectrometer 104 in the collection beam 108 is analyzed with regard to polarization state, allowing for spectral analysis of radiation passed by the analyzer. These spectra 111 are passed to the computing system 116 for analysis of the structure 114.

In a further embodiment, the metrology system 100 is a measurement system 100 that includes one or more computing systems 116 configured to execute model building tool 130 in accordance with the description provided herein. In the preferred embodiment, model building tool 130 is a set of program instructions 120 stored on a carrier medium 118. The program instructions 120 stored on the carrier medium 118 are read and executed by computing system 116 to realize model building functionality as described herein. The one or more computing systems 116 may be communicatively coupled to the spectrometer 104. In one aspect, the one or more computing systems 116 are configured to receive measurement data 111 associated with a measurement (e.g., critical dimension, film thickness, composition, process, etc.) of the structure 114 of specimen 112. In one example, the measurement data 111 includes an indication of the measured spectral response of the specimen by measurement system 100 based on the one or more sampling processes from the spectrometer 104. In some embodiments, the one or more computing systems 116 are further configured to determine specimen parameter values of structure 114 from measurement data 111. In one example, the one or more computing systems 116 are configured to access model parameters in real-time, employing Real Time Critical Dimensioning (RTCD), or it may access libraries of pre-computed models for determining a value of at least one specimen parameter value associated with the target structure 114.

In addition, in some embodiments, the one or more computing systems 116 are further configured to receive user input 113 from a user input source 103 such as a graphical user interface, keyboard, etc. The one or more computer systems are further configured to configure re-useable, parametric sub-structure models as described herein.

In some embodiments, measurement system 100 is further configured to store one or more re-useable, parametric sub-structure models 115 in a memory (e.g., carrier medium 118).

It should be recognized that the various steps described throughout the present disclosure may be carried out by a single computer system 116 or, alternatively, a multiple computer system 116. Moreover, different subsystems of the system 100, such as the spectroscopic ellipsometer 101, may include a computer system suitable for carrying out at least a portion of the steps described herein. Therefore, the aforementioned description should not be interpreted as a limitation on the present invention but merely an illustration. Further, the one or more computing systems 116 may be configured to perform any other step(s) of any of the method embodiments described herein.

The computing system 116 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. In general, computing system 116 may be integrated with a measurement system such as measurement system 100, or alternatively, may be separate from any measurement system. In this sense, computing system 116 may be remotely located and receive measurement data and user input 113 from any measurement source and user input source, respectively.

Program instructions 120 implementing methods such as those described herein may be transmitted over or stored on carrier medium 118. The carrier medium may be a transmission medium such as a wire, cable, or wireless transmission link. The carrier medium may also include a computer-readable medium such as a read-only memory, a random access memory, a magnetic or optical disk, or a magnetic tape.

In addition, the computer system 116 may be communicatively coupled to the spectrometer 104 or the illuminator subsystem 102 of the ellipsometer 101, or the user input source 103 in any manner known in the art.

The computing system 116 may be configured to receive and/or acquire data or information from the user input source 103 and subsystems of the system (e.g., spectrometer 104, illuminator 102, and the like) by a transmission medium that may include wireline and/or wireless portions. In this manner, the transmission medium may serve as a data link between the computer system 116, user input source 103, and other subsystems of the system 100. Further, the computing system 116 may be configured to receive measurement data via a storage medium (i.e., memory). For instance, the spectral results obtained using a spectrometer of ellipsometer 101 may be stored in a permanent or semi-permanent memory device (not shown). In this regard, the spectral results may be imported from an external system. Moreover, the computer system 116 may send data to external systems via a transmission medium.

The embodiments of the system 100 illustrated in FIG. 2 may be further configured as described herein. In addition, the system 100 may be configured to perform any other block(s) of any of the method embodiment(s) described herein.

Optical metrology for critical dimensions (CDs), thin film thicknesses, optical properties and compositions, overlay, lithography focus/dose, etc. typically requires a geometric model of the underlying structure to be measured. This measurement model includes the physical dimensions, material properties, and parameterization of the structure.

In one aspect, a model building tool includes re-useable, parametric models of complex device sub-structures that are useable as building blocks in a model of a complex semiconductor device. This makes the model building process more intuitive and less error-prone. Furthermore, because the re-useable, parametric sub-structure models are optimized for specific structures and measurement applications, the resulting discretized measurement model is computationally more efficient than traditional models. In addition, the parametric sub-structure models can be saved and shared among different projects and different users.

In a further aspect, the re-useable, parametric sub-structure model is fully defined by the values of the independent parameters entered by the user of the model building tool. All other variables associated with the model shape and internal constraints among constituent geometric elements are pre-defined within the model. Thus, beyond the values of the independent parameters, no other user input is required to fully define the re-useable, parametric sub-structure model. This greatly simplifies the model building process.

Figure 3:
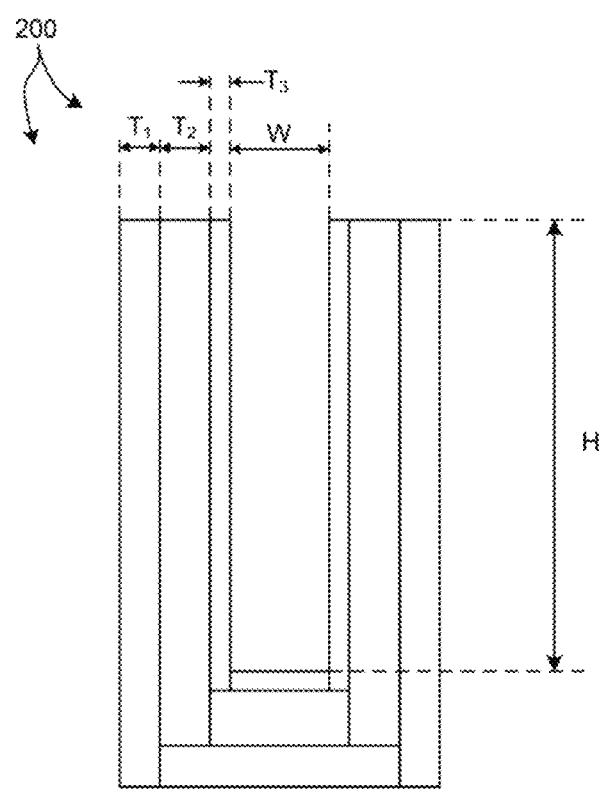
FIG. 3 is a diagram illustrative of a re-usable, parametric sub-structure model 200 representing three conformal layers of a trench structure.

In some embodiments, the re-useable, parametric sub-structure models are structure-specific. FIG. 3 depicts a re-usable, parametric sub-structure model 200 representing three conformal layers of a trench structure. As depicted in FIG. 3, the independent parameters that define the shape of the model are the thicknesses of each layer, $T_1$, $T_2$, and $T_3$, the width of the trench, W, and the depth of the trench, H. Optionally, material parameters associated each of the layers may be defined as independent variables that can be defined by a user.

A user of the model building tool only needs to enter the values of these five parameters to fully define the geometry of this re-useable, parametric sub-structure model 200. All of the other variables associated with the model shape and internal constraints are pre-defined within the model, and no further input is required to fully define the shape of model 210.

Figure 1A:
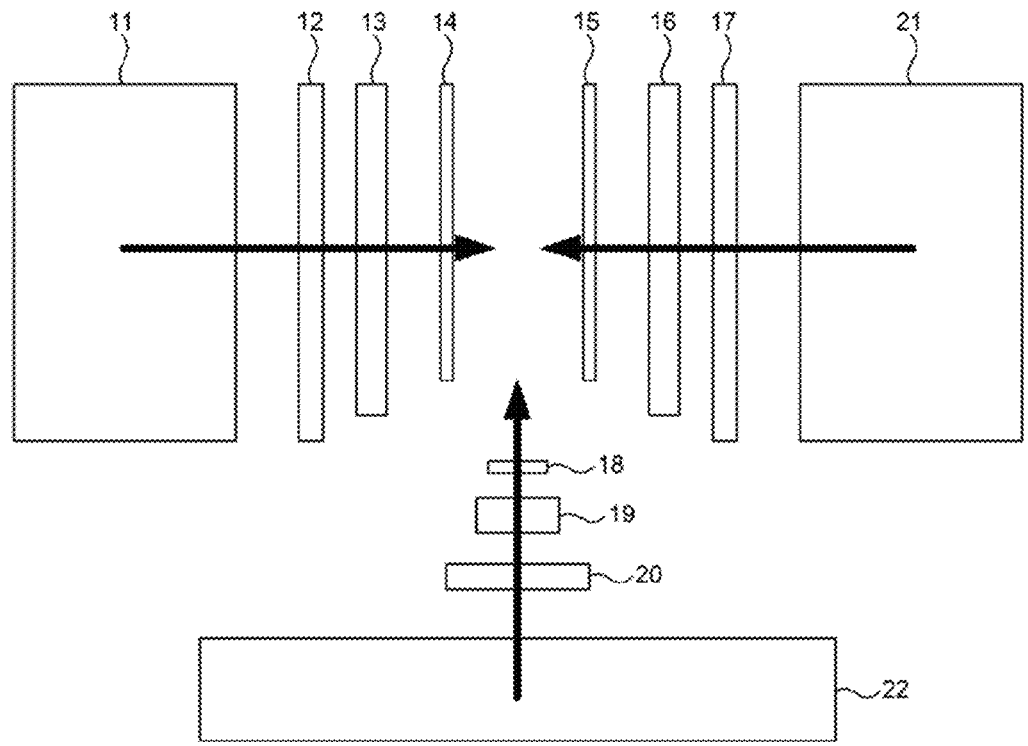
FIG. 1A is a diagram illustrative of twelve different primitive structural building blocks 11-22 assembled together to form an optical critical dimension (OCD) model 10 depicted in FIG. 1B.
Figure 1B:
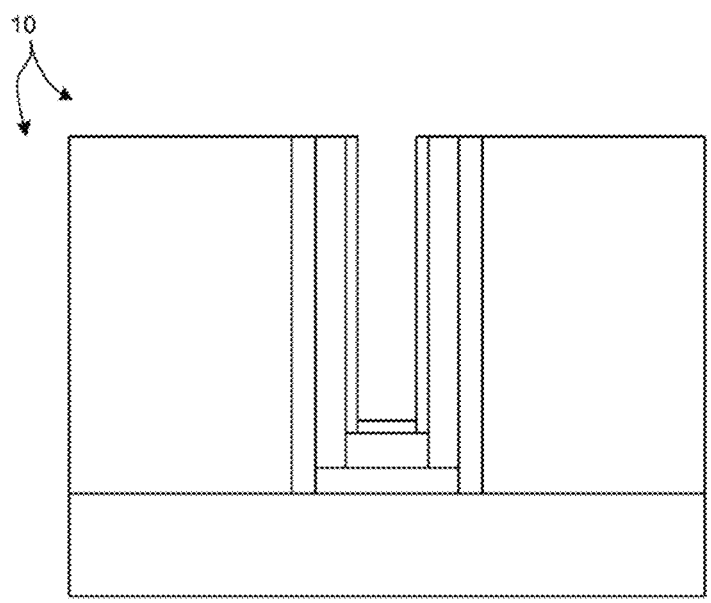
FIG. 1B is a diagram illustrative of an optical critical dimension (OCD) model 10.

In contrast, the structural model depicted in FIG. 1A requires the definition of nine different primitive elements (elements 12-20) and their interrelationships (e.g., constraints among each of the elements) to model a similar trench structure having three conformal layers. The user needs to define, combine, constrain, and parameterize these nine elements manually. For example, the user would have to constrain the right side of each of elements 12, 13, and 14 to align with the left side of elements 20, 19, and 18, respectively. Similarly, the user would have to constrain the left side of each of elements 15, 16, and 17 with the right side of elements 18, 19, and 20, respectively. In addition, the user would have to constrain the height of each of elements 18, 19, and 20 to be equal to the width of the side pieces 14 and 15, 13 and 16, and 12 and 17, respectively. These constraint examples are just a subset of an even larger set of constraints that must be established by the user to fully define a simple trench structure having three conformal layers. Thus, it is not difficult to imagine the difficulty associated with defining a model of a complex device structure using only simple geometric primitives. As depicted in FIG. 3, a single re-useable, parametric sub-structure model 200 that is fully defined by only five independent parameters replaces a model that includes nine geometric primitives and dozens of constraints and shape parameter values.

Figure 4:
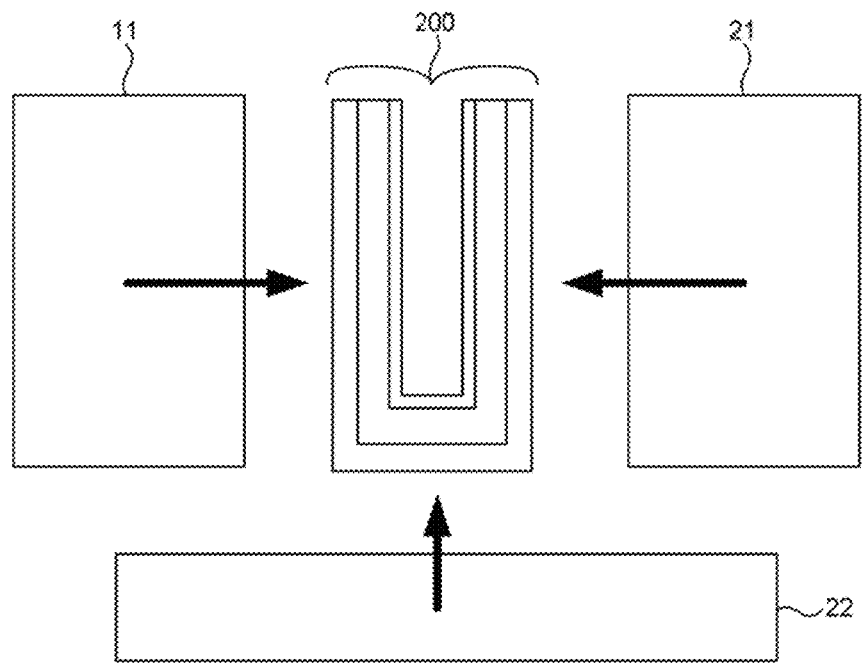
FIG. 4 is a diagram illustrative of a combination of geometric primitives with a re-useable, parametric sub-structure model to form the measurement model depicted in FIG. 5.
Figure 5:
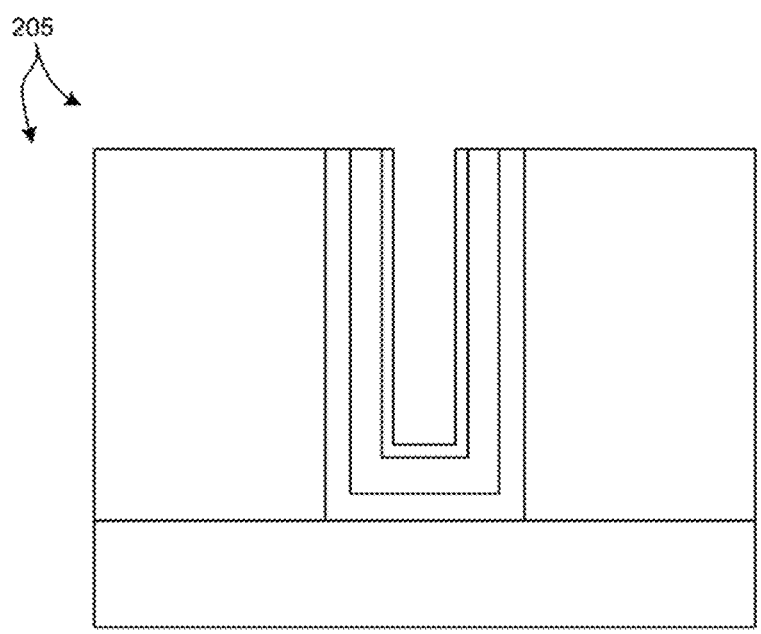
FIG. 5 is a diagram illustrative of a measurement model formed from the combination of geometric primitives and a re-useable, parametric sub-structure model depicted in FIG. 4.

In another further aspect, a model building tool integrates one or more re-useable, parametric models into a measurement model of a complex semiconductor device. As depicted in FIG. 4, a model building tool receives input from a user to combine geometric primitives 11, 21, and 22 with re-useable, parametric sub-structure model 200 to form a measurement model 205 depicted in FIG. 5. In some other embodiments, a measurement model of a semiconductor device is fully described by one re-useable, parametric model. In some other embodiments, a measurement model of a semiconductor device is fully described by a combination of two or more re-useable, parametric models.

In another aspect, a model building tool generates a re-useable, parametric sub-structure model based on input from a user.

In some embodiments, a model building tool generates a re-useable, parametric sub-structure model based on a composition of a number of simpler geometric primitives, or simpler re-useable, parametric sub-structure models indicated by a user. The composition changes the collection of individual models into a single re-useable, parametric sub-structure model that can be used as an element of a measurement model as if it is a primitive building block.

As depicted in FIG. 3, nine geometric primitives (e.g., rectangular shapes) are fully integrated into a sub-structure model that is fully defined by five independent parameters. The model building tool saves the sub-structure model for later use. Internally, the sub-structure model includes the constraints necessary to fully integrate the nine geometric primitives. These constraints are saved as part of the sub-structure model and are enforced at every instance of the sub-structure model. In this manner, users can create a collection of commonly used complex shapes with pre-defined constraints. The sub-structure model can be unloaded and saved into files, reloaded into a project and used, and shared among users.

The re-useable, parametric sub-structure models generated by the model building tool enable a user or group of users to generate a library of sub-structures that can be reused. Different users who use different instances of the same sub-structure model can expect to achieve the same numerical results.

Figure 6:
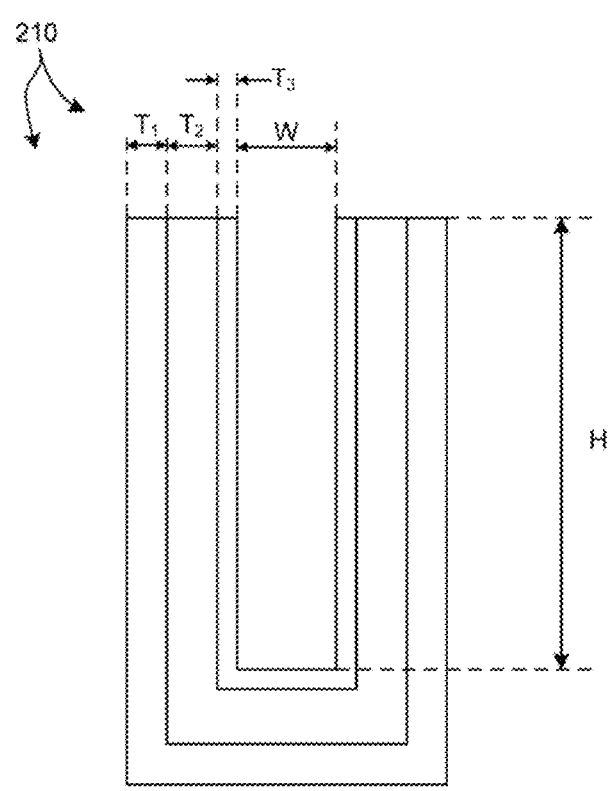
FIG. 6 is a diagram illustrative of a re-usable, parametric sub-structure model 210 representing three conformal layers of a trench structure in another embodiment.

Re-useable, parametric sub-structure models can be generated in different ways. In one example, a user directs the model building tool to combine and constrain one or more geometric primitives, one or more existing sub-structure models, or any combination by user-generated computer code. FIG. 6 depicts a re-useable, parametric sub-structure model 210 assembled based on user-generated computer code that is defined by its independent parameters, $T_1$, $T_2$, $T_3$, W, and H, in a manner similar to model 200 depicted in FIG. 3. However, re-useable, parametric sub-structure model 210 is based on more complex geometric structures (U-shapes), and thus is an amalgamation of fewer, more complex geometric primitives. As a result, model 210 includes fewer vertices than model 200. This results in a smoother model discretization that yields a more computationally efficient measurement model due to a reduced number of discretization points. In general, models that contain fewer geometric building blocks and fewer constraints results in a faster discretization as the discretization engine no longer needs to parse through so many geometric building blocks and constraints. In some embodiments, the discretization points of a first re-useable, parametric model are aligned with the discretization points of a second re-useable, parametric model within a floating point precision of the underlying computing system to ensure repeatable computational results from the combined model.

In some other examples, a user may interact with a graphical user interface (GUI) that allows a user to select one or more geometric primitives, one or more existing sub-structure models, or any combination, and then indicate the users desire to group these elements together and select the desired independent parameters. In response the model building tool automatically generates the appropriate constraints to realize a fully integrated parametric sub-structure model. The user can then export the newly created parametric sub-structure model into a file that can be used by others. In another example, the newly created parametric sub-structure model can be listed in the model building tool as an available building block that can be selected by a user to construct a measurement model, or yet another, more complex parametric sub-structure model. The re-usable parametric sub-structure models allow multiple users to collaboratively work on different parts of a complex model and assembly them together at the final stage.

Figure 9:
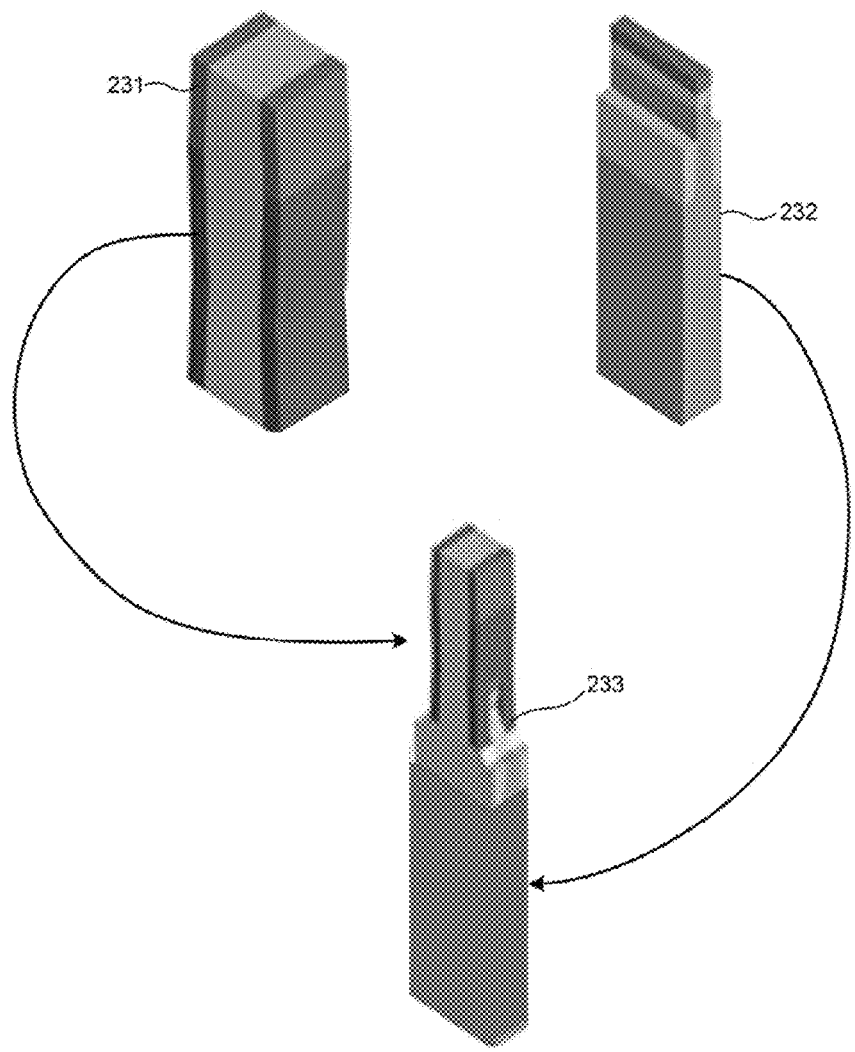
FIG. 9 depicts two different re-useable, parametric sub-structure models 231 and 232 combined into a fully integrated parametric sub-structure model 233 by a model building tool as described herein.

FIG. 9 depicts two different re-useable, parametric sub-structure models 231 and 232. In one example, a user may interact with a graphical user interface (GUI) that allows the user to select models 231 and 232 and specify the desire to group these elements together with model 231 located on top of model 232. In response the model building tool automatically generates the appropriate constraints to realize fully integrated parametric sub-structure model 233. The user can then export the newly created parametric sub-structure model into a file that can be used by others.

The number of components required to assemble a complex device model is significantly reduced by combining two or more re-useable, parametric sub-structure models, rather than geometric primitives. Moreover, the numbers of relationships among the components that must be specified by the user are also significantly reduced. This simplifies the initial model building process, makes it less error-prone, and makes it easier to transfer models between different users.

In another further aspect, the model building tool generates and makes available for use, re-useable, parametric models of complex device sub-structures that include key characteristics of specific semiconductor processes embedded into their design. More specifically, a re-usable, parametric sub-structure model includes controls that allow the user to specify wafer artifacts created by one or more process steps.

Figure 7A:
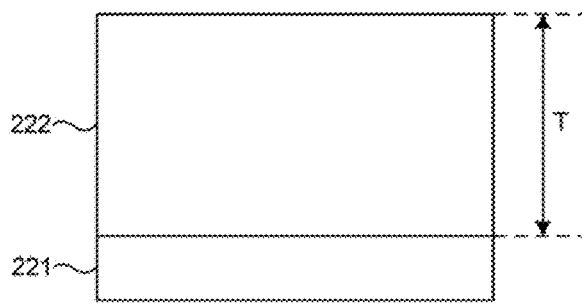
FIGS. 7A-7D depict four basic manufacturing process steps employed to generate a semiconductor device structure.
Figure 7B:
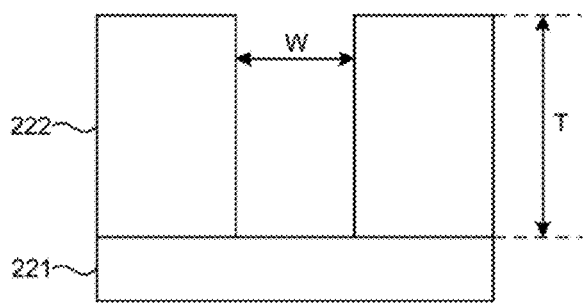
Figure 7C:
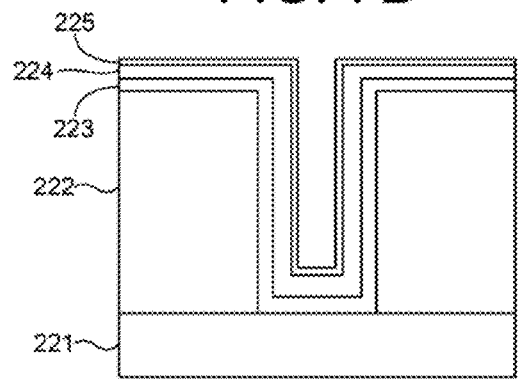
Figure 7D:
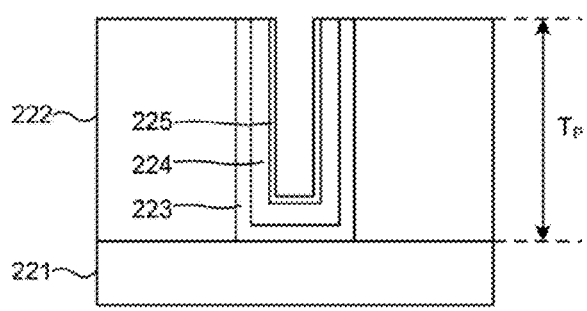

FIGS. 7A-7D depict four basic manufacturing process steps to generate the structure depicted in FIG. 7D. First, a film 22 of thickness, T, is deposited on a substrate 221 as depicted in FIG. 7A. Next, a trench of width, W, is etched into the film layer 222 as depicted in FIG. 7B. Next, materials 223, 224, and 225, are conformally deposited over the film and trench as depicted in FIG. 7C. Finally, the structure is planarized to a height, $T_p$, as depicted in FIG. 7D.

In one embodiment, a re-useable, parametric model represents all four of these steps. Furthermore, the user is able to select which process step to model. For example, if a user wants to first model the trench etch process step, the user controls the re-useable, parametric model to include the processes needed to create the trench etch (i.e., the film deposition and trench etch steps). The user would define the material used in the film deposition step, define the thickness of the deposited film, and define the dimensions of the trench. If the user wants to model the planarization step, the user starts with the previously defined trench etch model and then controls the re-useable, parametric model to include the processes needed to create the planarized structure (i.e., the conformal deposition and planarization steps). The user would define the number of conformal depositions and the materials/thicknesses for each deposition define the depth of the planarization. In this manner, the user is able to individually control each of the process steps represented by the re-useable, parametric model. Thus, a single model can be utilized to measure multiple process steps.

In some lithography focus/dose applications, resist lines of stacked device structures are modeled as stacked trapezoids that are constrained in the following manner: 1) the top critical dimension (TCD) and bottom critical dimension (BCD) of adjacent trapezoids are constrained to be equal, 2) the heights of the individual trapezoids are constrained to be equal, 3) the individual critical dimensions are constrained to be functions of user-defined focus and dose parameters, and 4) the height of the individual trapezoids is constrained to be a function of the aforementioned focus and dose parameters. Traditionally, all of these constraints need to be set by the user.

In another further aspect, the model building tool generates and makes available for use, re-useable, parametric models of complex device sub-structures that include measurement application specific details (e.g., constraints, dimensions, etc. that derive from particular applications).

Figure 8:
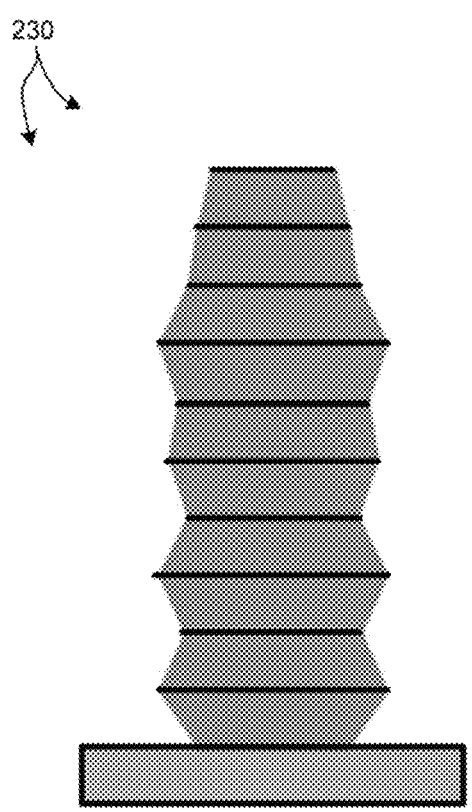
FIG. 8 depicts a re-usable, parametric sub-structure model 230 of a stacked device structure.

FIG. 8 depicts a re-usable, parametric sub-structure model 230 of a stacked device structure. In this example, the model building tool reads a file that contains the equations of the individual CDs and heights. This file is typically generated by a lithography simulator such as PROLITH software available from KLA-Tencor Corporation, Milpitas, Calif. (USA). Based on this application information the model building tool automatically sets the parameterization and constraints of the re-usable, parametric sub-structure model 230.

In another example, the model building tool can also be employed to generate re-usable, parametric sub-structure models that describe field enhancement elements used in some optical metrology applications. Field enhancement elements are described in further detail in U.S. Pat. No. 8,879,073 assigned to KLA-Tencor Corporation, the subject matter of which is incorporated herein by reference its entirety. The model building tool can be employed to generated re-usable, parametric sub-structure models for each type of field enhancement element and different applications.

In yet another example, the model building tool can also be employed to generate re-usable, parametric sub-structure models that describe metrology targets generated by metrology target design or overlay design software. In one example, the model building tool receives graphical database system (GDS) data generated by a software simulator and automatically generates re-usable, parametric sub-structure models that predicts the morphology of spacer pitch splitting.

In yet another aspect, the model building tool includes security features to control the sharing of sensitive intellectual property with particular users. For example, it may be desireable an entity to share a measurement model with another entity, but without sharing particular aspects of the measurement model that include sensitive intellectual property. In some examples, the model building tool allows a user to hide all or part of one or more re-useable, parametric sub-structure models from display to allow the models to be shared with other entities. In some examples, the model building tool allows a user to omit all or part of one or more re-useable, parametric sub-structure models to prevent sharing of these sensitive elements with another entity. In some other examples, the model building tool allows a user to include password protection to control access to all or part of one or more re-useable, parametric sub-structure models to limit the sharing of sensitive elements to authorized entities. In this manner, sensitive intellectual property embodied in certain features of the re-useable, parametric sub-structure models can be kept private by the user.

Although the methods discussed herein are explained with reference to system 100, any optical metrology system configured to illuminate and detect light reflected, transmitted, or diffracted from a specimen may be employed to implement the exemplary methods described herein. Exemplary systems include an angle-resolved reflectometer, a scatterometer, a reflectometer, an ellipsometer, a spectroscopic reflectometer or ellipsometer, a beam profile reflectometer, a multi-wavelength, two-dimensional beam profile reflectometer, a multi-wavelength, two-dimensional beam profile ellipsometer, a rotating compensator spectroscopic ellipsometer, etc. By way of non-limiting example, an ellipsometer may include a single rotating compensator, multiple rotating compensators, a rotating polarizer, a rotating analyzer, a modulating element, multiple modulating elements, or no modulating element.

It is noted that the output from a source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, infrared, and X-ray), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a site, or sites, on a wafer, a reticle, or any other sample that may be processed (e.g., printed or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
    an illumination source configured to provide an amount of illumination light to one or more metrology targets;
    a detector configured to receive an amount of collected light from the one or more metrology targets in response to the amount of illumination light;
    one or more computer systems configured to:
        receive an amount of measurement data associated with the detected light; and
        determine one or more parameters of a measurement model of the one or more metrology targets based on a fitting of the measurement model to the amount of measurement data, wherein the measurement model includes a first re-useable, parametric model of a first sub-structure of the one or more metrology targets; and
    a metrology model building tool comprising computer-readable instructions stored on a non-transitory, computer-readable medium, the computer-readable instructions comprising:
        code for causing the one or more computer systems to receive an indication of a selection of the first re-useable, parametric model by a first user to describe at least a portion of the one or more metrology targets, wherein the first re-useable, parametric model includes multiple geometric elements and is fully defined by a first set of independent parameter values; and
        code for causing the one or more computer systems to receive an indication of a selection of the first set of independent parameter values.

2. The metrology system of claim 1, wherein the measurement model of the one or more metrology targets is fully described by the first re-useable, parametric model.

3. The metrology system of claim 1, the computer-readable instructions further comprising:
    code for causing the one or more computer systems to receive an indication of a selection of a second re-usable, parametric model by the first user to describe a sub-structure of the one or more metrology targets, wherein the second re-useable, parametric model includes multiple geometric elements and is fully defined by a second set of independent parameter values;
    code for causing the one or more computer systems to receive an indication of a selection of the second set of independent parameter values;
    code for causing the one or more computer systems to determine a first measurement model of the one or more metrology targets based at least in part on a combination of the first and second re-useable, parametric models; and
    code for causing the one or more computer systems to store the first measurement model in a memory.

4. The metrology system of claim 1, wherein the selection of the first set of independent parameter values that define the first re-useable, parametric model is made by the first user.

5. The metrology system of claim 1, the computer-readable instructions further comprising:
    code for causing the one or more computer systems to receive an output file generated by a process simulation tool; and
    code for causing the one or more computer systems to determine the first set of independent parameter values from the output file.

6. The metrology system of claim 1, wherein a plurality of discretization points of the first re-useable, parametric model of the first sub-structure are aligned with a plurality of discretization points of the second re-useable, parametric model of the second sub-structure within a floating point precision of the one or more computer systems.

7. The metrology system of claim 1, the computer-readable instructions further comprising:
    code for causing the one or more computer systems to receive an indication of a selection of the first re-useable, parametric model by a second user to describe a first sub-structure of a second semiconductor device;
    code for causing the one or more computer systems to receive an indication of a selection of a third re-usable, parametric model by the second user to describe a second sub-structure of the second semiconductor device, wherein the third re-useable, parametric model is fully defined by a third set of independent parameter values;
    code for causing the one or more computing systems to determine a second measurement model based at least in part on a combination of the first and third re-useable, parametric models; and code for causing the one or more computing systems to store the second measurement model in a memory.

8. The metrology system of claim 1, the computer-readable instructions further comprising:
   code for causing the one or more computing systems to receive an indication of a selection of the first measurement model of the one or more metrology targets;
   code for causing the one or more computing systems to receive an indication of a selection of a third re-useable, parametric model, wherein the third re-useable, parametric model is fully defined by a third set of independent parameter values;
   code for causing the one or more computing systems to determine a second measurement model based at least in part on a combination of the first measurement model and the third re-useable, parametric model; and
   code for causing the one or more computing systems to store the second measurement model in a memory.

9. The metrology system of claim 1, the computer-readable instructions further comprising:
   code for causing the one or more computing systems to hide a portion of a sub-structure of the one or more metrology targets from display to the first user.

10. The metrology system of claim 1, wherein the first re-useable, parametric model of at least a portion of the one or more metrology targets includes geometric features and interrelationships among geometric features that are specific to a particular measurement application.

11. A metrology system comprising:
    an illumination source configured to provide an amount of illumination light to one or more metrology targets;
    a detector configured to receive an amount of collected light from the one or more metrology targets in response to the amount of illumination light;
    one or more computer systems configured to:
       receive an amount of measurement data associated with the detected light; and
       determine one or more parameters of a measurement model of the one or more metrology targets based on a fitting of the measurement model to the amount of measurement data, wherein the measurement model includes a first re-useable, parametric model of at least a portion of the one or more metrology targets; and
    a metrology model building tool comprising computer-readable instructions stored on a non-transitory, computer-readable medium, the computer-readable instructions comprising:
       code for causing a computer to receive an indication of a selection by a user of a plurality of primitive geometric modeling elements;
       code for causing the computer to receive an indication from the user indicating a desired position of each of the plurality of primitive geometric modeling elements with respect to the other primitive geometric modeling elements;
       code for causing the computer to receive an indication from the user indicating a desired parameterization of the plurality of primitive geometric modeling elements;
       code for causing the computer to determine the first re-usable, parametric model based on a combination of the plurality of primitive geometric elements, wherein the first re-useable, parametric model is fully defined by a set of independent parameters associated with the desired parameterization; and
       code for causing the computer to store the first re-useable, parametric model in a memory.

12. The metrology system of claim 11, wherein the determining of the first re-usable, parametric model involves generating a set of constraint relationships that fully integrate the plurality of primitive geometric modeling elements into the re-useable, parametric model that is fully defined by the set of independent parameters.

13. The metrology system of claim 11, the computer-readable instructions further comprising:
    code for causing the computer to receive an indication of a selection by the user of the first re-useable, parametric model;
    code for causing the computer to receive an indication of a selection by the user of a second re-usable, parametric model of another portion of the one or more metrology targets, wherein the second re-useable, parametric model includes multiple geometric elements and is fully defined by a second set of independent parameter values;
    code for causing the computer to determine the measurement model of the one or more metrology targets based at least in part on a combination of the first and second re-useable, parametric models; and
    code for causing the computer to store the measurement model in a memory.

14. The metrology system of claim 13, the computer-readable instructions further comprising:
    code for causing the computer to receive an indication from the first user of the first set of independent parameter values; and
    code for causing the first computer to receive an indication from the first user of the second set of independent parameter values.

15. The metrology system of claim 13, the computer-readable instructions further comprising:
    code for causing the computer to receive an output file generated by a process simulation tool; and
    code for causing the computer to determine the first set of independent parameter values from the output file.

16. The metrology system of claim 13, wherein the measurement model is fully defined by a third set of independent parameter values that includes at least a portion of the first set of independent parameter values and the second set of independent parameter values.

17. The metrology system of claim 11, the computer-readable instructions further comprising:
    code for causing the computer to hide a portion of a sub-structure of the one or more metrology targets from display to the user.

18. A metrology system comprising:
    an illumination source configured to provide an amount of illumination light to one or more metrology targets;
    a detector configured to receive an amount of collected light from the one or more metrology targets in response to the amount of illumination light; and
    one or more computer systems configured to:
       receive an amount of measurement data associated with the detected light; and
       determine one or more parameters of a measurement model of the one or more metrology targets based on a fitting of the measurement model to the amount of measurement data, wherein the measurement model includes a first re-useable, parametric model of a first sub-structure of the one or more metrology targets, and wherein the first re-useable, parametric model includes multiple geometric elements and is fully defined by a first set of independent parameter values.

19. The metrology system of claim 18, wherein the measurement model also includes a second re-useable, parametric model of a second sub-structure of the one or more metrology targets, and wherein the second re-useable, parametric model includes multiple geometric elements and is fully defined by a second set of independent parameter values.

20. The metrology system of claim 19, wherein a plurality of discretization points of the first re-useable, parametric model of the first sub-structure are aligned with a plurality of discretization points of the second re-useable, parametric model of the second sub-structure within a floating point precision of the one or more computer systems.

* * * * *